United States Patent
Suthiwongsunthorn et al.

(10) Patent No.: US 9,613,877 B2
(45) Date of Patent: Apr. 4, 2017

(54) SEMICONDUCTOR PACKAGES AND METHODS FOR FORMING SEMICONDUCTOR PACKAGE

(71) Applicant: UNITED TEST AND ASSEMBLY CENTER LTD., Singapore (SG)

(72) Inventors: Nathapong Suthiwongsunthorn, Singapore (SG); John Ducyao Beleran, Singapore (SG); Serafin Padilla Pedron, Jr., Manteca, CA (US)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 14/051,417

(22) Filed: Oct. 10, 2013

(65) Prior Publication Data

US 2015/0102478 A1 Apr. 16, 2015

(51) Int. Cl.
*H01L 23/495* (2006.01)
*H01L 21/02* (2006.01)
(Continued)

(52) U.S. Cl.
CPC ............. *H01L 23/04* (2013.01); *H01L 24/29* (2013.01); *H01L 24/32* (2013.01); *H01L 24/45* (2013.01); *H01L 24/48* (2013.01); *H01L 24/73* (2013.01); *H01L 24/85* (2013.01); *H01L 2224/2919* (2013.01); *H01L 2224/32225* (2013.01); *H01L 2224/4569* (2013.01); *H01L 2224/45139* (2013.01); *H01L 2224/45144* (2013.01); *H01L 2224/45147* (2013.01); *H01L 2224/45565* (2013.01); *H01L 2224/48091* (2013.01); *H01L 2224/48227* (2013.01); *H01L 2224/48465* (2013.01); *H01L 2224/48471* (2013.01); *H01L 2224/48479* (2013.01); *H01L 2224/73265* (2013.01); *H01L 2224/8592* (2013.01); *H01L 2224/92247* (2013.01); *H01L 2924/10158* (2013.01); *H01L 2924/15311* (2013.01);
(Continued)

(58) Field of Classification Search
CPC ... H01L 2924/1461; H01L 2224/85205; H01L 2224/73265; H01L 2924/3025; H01L 2224/81203; H01L 23/5389; H01L 24/03; H01L 24/11; H01L 24/19; H04R 19/04; H04R 1/04; H04R 2201/003; H04R 1/342; B81B 2201/0257
USPC .................................................. 257/675–685
See application file for complete search history.

(56) References Cited

U.S. PATENT DOCUMENTS 5,206,794 A 4/1993 Long
5,396,104 A 3/1995 Kimura
(Continued)

*Primary Examiner* — Marc Armand
*Assistant Examiner* — Nelson Garces
(74) *Attorney, Agent, or Firm* — Horizon IP Pte. Ltd.

(57) ABSTRACT

Semiconductor packages and methods for forming a semiconductor package are presented. The semiconductor package includes a package substrate having a die region on a first surface thereof. The package includes a die having a sensing element. The die is disposed in the die region and is electrically coupled to contact pads disposed on the first surface of the package substrate by insulated wire bonds. A cap is disposed over the first surface of the package substrate. The cap and the first surface of the package substrate define an inner cavity which accommodates the die and the insulated wire bonds. The insulated wire bonds are directly exposed to an environment through at least one access port of the package.

18 Claims, 15 Drawing Sheets

(51) Int. Cl.
    *H01L 29/84*     (2006.01)
    *H01L 23/04*     (2006.01)
    *H01L 23/00*     (2006.01)

(52) U.S. Cl.
    CPC ............... *H01L 2924/16151* (2013.01); *H01L 2924/16152* (2013.01); *H01L 2924/181* (2013.01)

(56) References Cited

U.S. PATENT DOCUMENTS

| | | |
|---|---|---|
| 5,527,742 A | 6/1996 | Weiler et al. |
| 5,736,792 A | 4/1998 | Orcutt |
| 5,776,786 A | 7/1998 | Nakamura et al. |
| 6,781,231 B2 | 8/2004 | Minervini |
| 6,955,949 B2 | 10/2005 | Batish et al. |
| 6,956,283 B1 * | 10/2005 | Peterson ........................ 257/680 |
| 7,102,209 B1 * | 9/2006 | Bayan ................. H01L 23/3107 257/666 |
| 7,344,920 B1 * | 3/2008 | Kirloskar .......... H01L 21/4828 257/666 |
| 7,348,663 B1 | 3/2008 | Kirloskar et al. |
| 2004/0124545 A1 | 7/2004 | Wang |
| 2004/0164126 A1 * | 8/2004 | Harun ................. B23K 20/004 228/180.5 |
| 2007/0040231 A1 * | 2/2007 | Harney ................... B81B 7/007 257/415 |
| 2007/0126094 A1 * | 6/2007 | Shojaie ................. H01L 21/568 257/676 |
| 2007/0295982 A1 * | 12/2007 | Ryu et al. ........................ 257/99 |
| 2008/0150104 A1 * | 6/2008 | Zimmerman ......... B81B 7/0064 257/676 |
| 2012/0108013 A1 * | 5/2012 | Fujisawa ............. H01L 21/4842 438/123 |

\* cited by examiner

100d (d)

(e)

(e)

(f)

(g)

(h)

600

(a)

(b)

(c)

700

(d)

(e)

(f)

700

(d)

(d¹)

(e)

SEMICONDUCTOR PACKAGES AND METHODS FOR FORMING SEMICONDUCTOR PACKAGE

BACKGROUND

Sensing elements used for detecting different environmental parameters, such as velocity, speed, gravitational force, pressure, electromagnetic radiation, are widely used in various devices. As technology advances, sensing devices with higher speed and sensitivity are of high demand. However, the current processes used for producing these sensing devices are relatively complex, require more material and thus lead to higher manufacturing cost.

From the foregoing discussion, there is a desire to provide an improved and simplified package for sensing devices. It is also desirable to provide simplified methods to produce a reliable package for sensing devices at relatively low cost.

SUMMARY

Embodiments generally relate to semiconductor packages and methods for forming a semiconductor package. In one embodiment, a semiconductor package is disclosed. The semiconductor package includes a package substrate having a die region on a first surface thereof. The package includes a die having a sensing element. The die is disposed in the die region and is electrically coupled to contact pads disposed on the first surface of the package substrate by insulated wire bonds. A cap is disposed over the first surface of the package substrate. The cap and the first surface of the package substrate define an inner cavity which accommodates the die and the insulated wire bonds. The insulated wire bonds are directly exposed to an environment through at least one access port of the package.

In another embodiment, a method for forming a semiconductor package is presented. The method includes providing a package substrate having a die region on a first surface thereof. A die having a sensing element is provided. The die is attached to the die region. The die is electrically coupled to the contact pads disposed on the first surface of the package substrate by insulated wire bonds. A cap is provided over the first surface of the package substrate. The cap and the first surface of the package substrate define a cavity which accommodates the die and the insulated wire bonds. The insulated wire bonds are directly exposed to an environment through at least one access port of the package.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
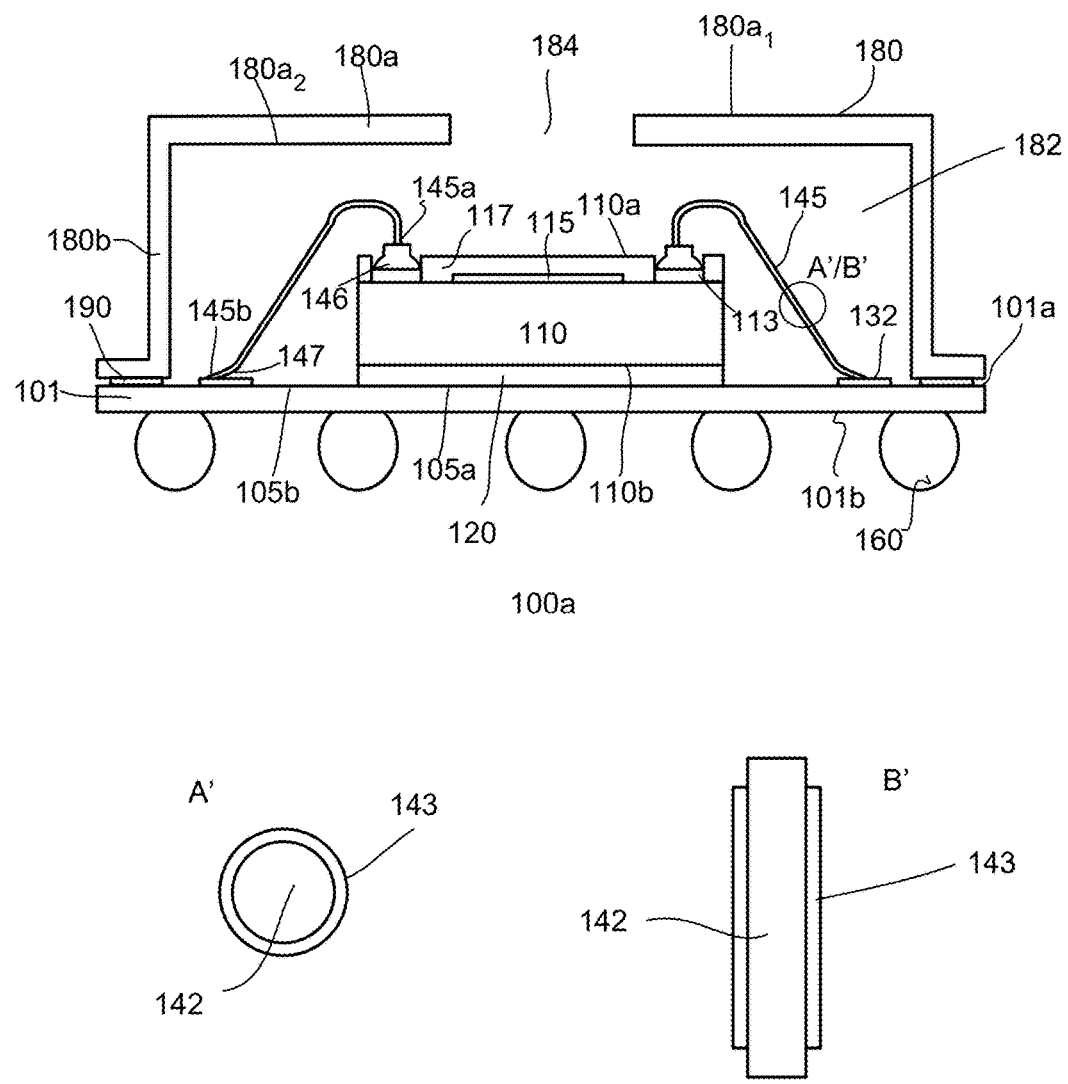
FIGS. 1a-1e show simplified cross-sectional views of various embodiments of a package.

Embodiments generally relate to semiconductor packages and methods for forming a semiconductor package. The packages are used to package one or more semiconductor dies or chips. The die, for example, includes a sensor or sensing element. The die, for example, may be a micro-electro-mechanical systems (MEMS) die suitable for use in microphone, gyroscope, accelerometer, optical sensor, etc. For the case of more than one die, the dies may be arranged in a planar arrangement, vertical arrangement, or a combination thereof. The packages may be incorporated into electronic products or equipment, such as automotive products, phones, computers as well as mobile and mobile smart products. Incorporating the packages into other types of products may also be useful.

FIGS. 1a-1e show simplified cross-sectional views of various embodiments of a package. The semiconductor packages 100a-100e, as shown in FIGS. 1a-1e, include a package substrate 101. The package substrate includes first and second major surfaces 101a-101b. The first major surface 101a, for example, may be referred to as the top surface and the second major surface 101b, for example, may be referred to as the bottom surface. Other designations for the surfaces may also be useful.

The package substrate may be a single layer substrate or a multi-layer substrate. For a multi-layer substrate, the different layers can be laminated or built-up. Various materials can be used to form the package substrate. In one embodiment, the package substrate includes a printed circuit board (PCB) substrate. The PCB substrate, for example, includes a glass-reinforced epoxy, such as a FR-4 based laminated substrate. In another example, the substrate may include a polymer substrate which is not internally reinforced, such as but not limited to polyimide substrate. Other types of PCB materials are also useful. Alternatively, the package substrate includes ceramic or semiconductor based substrate. In another embodiment, the package substrate includes a metallic structure which provides both a die attach or mounting region for a die and electrical connections to the die and to external component. Other suitable types of substrate materials may also be used as the package substrate.

In one embodiment, the first major surface of the package substrate includes first and second regions. The first region 105a, for example, is a die or chip region on which a die 110 is mounted and the second region 105b, for example, is a non-die region. In one embodiment, the non-die region surrounds the die region. The die region, for example, may be disposed in a central portion of which the die is mounted and a non-die region which is outside of the die region. The die region, for example, may be concentrically disposed within the periphery of the package substrate. Other configurations of die and non-die regions may also be useful.

Conductive traces (not shown) are formed on at least the first major surface of the package substrate. Generally, conductive traces are provided on both the first and second major surfaces. The traces on the first major surface are coupled to the traces on the second major surface by vias (not shown), which are electrically coupled to package contacts 160 mounted on the second major surface of the package substrate. In one embodiment, contact/bond pads 132 are provided on the non-die region of the substrate. For example, each of the conductive traces includes a contact/bond pad region and/or a line region. The contact pads are disposed on the contact/bond pad regions of the conductive traces on the first major surface for coupling with a semiconductor die or chip. Providing contact pads on the second or on both major surfaces is also useful. The contact pads, in one embodiment, include a conductive layer, such as Cu, Al, Ag, Au, or any alloy thereof. Alternatively, the contact pads may include a plurality of conductive layers stacked one on another. Other suitable types of conductive material may also be useful.

Package contacts 160 are disposed on the second major surface of the package substrate. The package contacts, for example, are spherical shaped structures or balls. The package contacts protrude from the second major surface of the package substrate. Providing package contacts which do not protrude from the second major surface of the package substrate, such as solder lands, may also be useful. The package contact is formed of a conductive material. The package contacts, for example, can be formed from solder. Various types of solder can be used to form the package contacts. For example, the solder can be a lead-based or non lead-based solder. Other suitable types of conductive materials may also be used to form the package contacts.

A semiconductor die 110 is mounted on the substrate. The die includes a micro-electro-mechanical systems (MEMS) device, for instance, a cantilever switch beam, resonator mass, capacitor electrode or any combination thereof. The MEMS device may function as, for example, a transducer, a sensor, an actuator or combination thereof, depending on the specific application. In one embodiment, the die includes a sensor or sensing element 115 which requires access to or in communication with an environment, including internal environment and external environment outside of the package. In a more specific example, the die, being a sensor and having a sensing element, is a pressure sensor. Other types of sensor may also be useful. The die, as shown, includes active and inactive major surfaces 110*a*-110*b*. In one embodiment, the sensing element is disposed on the active major surface 110*a*. Providing the sensing element at other parts of the die may also be useful.

In some embodiments, the sensing element may be sealed under a cap layer (not shown) on top of which a final passivation layer 117 is disposed. In such case, the passivation layer covers the active surface of the die, such as that shown in FIG. 1*a*, except at the locations where die pads are disposed. In some other embodiments, such as for use in microphone application, the sensing element and locations where die pads are disposed are not covered by the passivation layer.

The active surface 110*a*, for example, includes die pads 113 to provide access to the internal circuitry of the die. As shown, the die pads are located on the active major surface and the periphery of the die. In one embodiment, the active surface of the die includes low to medium number of I/O connections or die pads for a die size of about, for example, 1 mm×1 mm. For example, the number of I/O connections or die pads is about 3-20. Other suitable numbers of die pads may also be useful. As shown, the active surface of the die may include openings in the final passivation layer to expose the die pads. Providing the die pads at other locations of the die can also be useful. In one embodiment, the inactive surface 110*b* is mounted onto the die attach region of the substrate. In one embodiment, the die is attached to the die attach region of the first major surface of the package substrate using an adhesive 120. The adhesive, in one embodiment, includes an insulating adhesive. Various suitable types of adhesives, for example, epoxy, paste, film or tape, can be used.

The die, in one embodiment, is electrically connected to the package substrate by wire bonds. The wire bonds, in one embodiment, include insulated wires 145. The insulated wires, for example, are attached to die pads of the die and to the contact pads on the first major surface of the package substrate. Simplified top and side cross-sectional views of the wire bonds are shown in A' and B' respectively in greater detail. The wire bonds, in one embodiment, include conductive wires 142 having an outer coating 143 as shown in A' and B'. The conductive wires, for example, include Au, Cu, Ag or any alloy thereof while the outer coating includes an insulation material, such as dielectric material. The dielectric material, for example, includes polymer. Any other suitable types of conductive and insulation materials may also be used for the conductive wires and the outer coating.

Figure 1B:
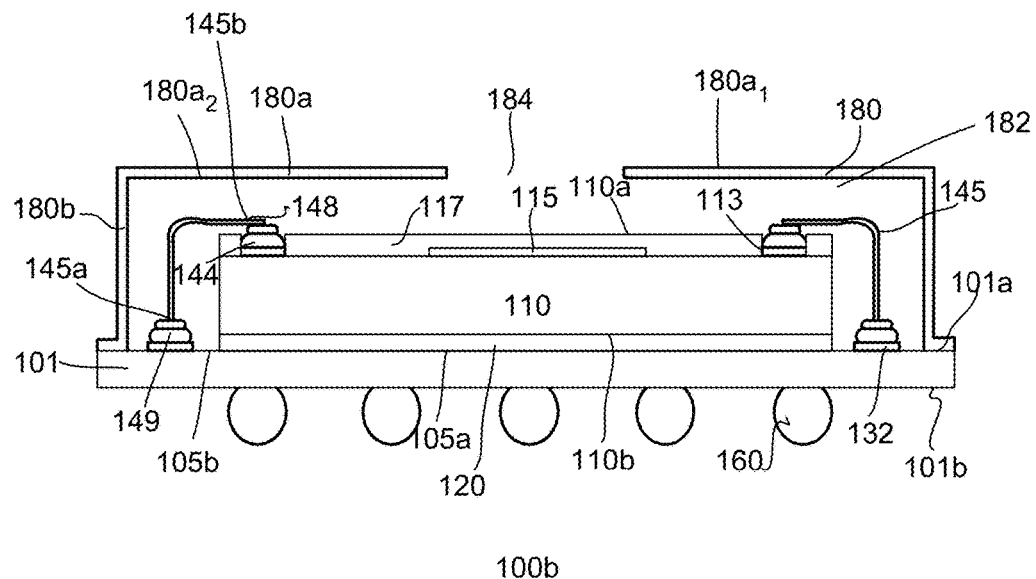

The outer coating, for example, includes sufficient thickness to protect the conductive wires. The thickness of the outer coating, for example, may be about 0.2-30% of the thickness of the conductive wires. For example, the thickness of the outer coating is about 50-7500 nm. Other suitable thickness ranges for the outer coating may also be useful. In one embodiment, a first end 145*a* of the wire bond is bonded to the die pad so as to form a ball bond 146 while a second end 145*b* of the wire bond is bonded to the contact pad so as to form a stitch or wedge bond 147 as shown in FIG. 1*a*. In an alternative embodiment, a stud bump 144 is formed on the die pad. A first end of the wire 145*a* including a ball 149 is connected to the contact pad and a second end of the wire 145*b* is bonded on the stud bump to form a stitch bond 148 as shown in FIG. 1*b*. Other suitable wire bond configurations may also be useful. The outer coating of the wire bond, for example, covers or extends to about the entire length of the wire. For example, the outer coating may cover or extend to about the entire length of the wire except at the ball or portion of the wedge bond or ball bond. The outer coating 143, for example, is conformal to the surface of the wire 142, including the bending portion of the wire. The outer coating, for example, should be sufficiently resilient and elastic such that neither cracking nor flaking would be found in the outer coating when the wire is processed.

In one embodiment, protective layers 150 may optionally be provided to cover or protect the stud bump, stitch or ball bond at the first or second end of the wire bond as illustrated in FIG. 1 *c*. Applying the protective layer to other parts of the wire, the die or combination thereof, may also be useful. The protective layers should be sufficient to cover and prevent oxidation on the stud bump and/or the stitch or ball bond. The protective layer provides the mechanical reinforcement to the bonding portion of the wire. The protective layer, for example, includes silica based gel, epoxy based adhesive or silicone based compound. The protective layer, for example, may be provided with or without any filler. For protective layer having filler, the filler size, for example, is smaller than the minimum pitch between two adjacent wire bonds. In one embodiment, the protective layer is a silicone compound without filler. Other suitable types of materials may also be used for the protective layer.

Figure 1C:
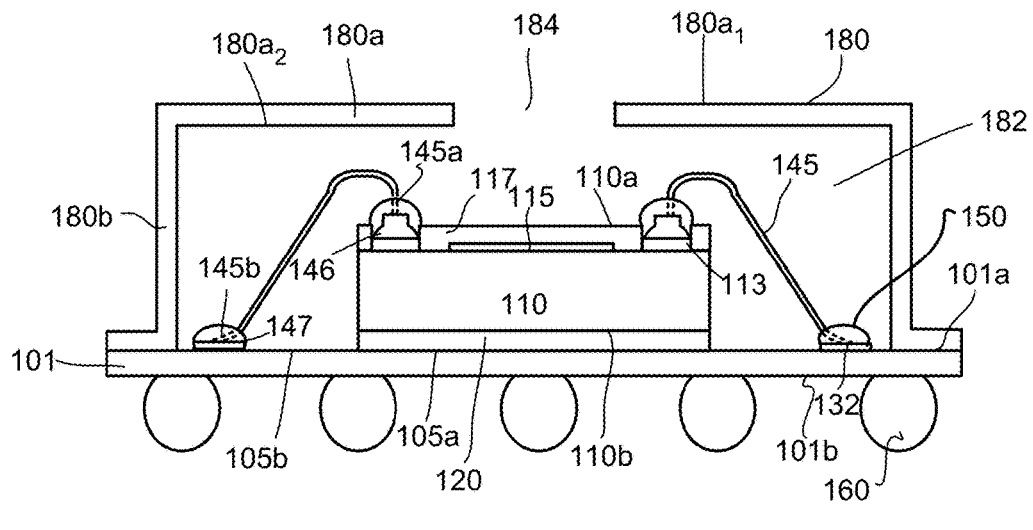

As described in FIGS. 1a-1c, the semiconductor package includes a semiconductor die which includes a sensor or sensing element. In addition to the semiconductor die, one or more different types of dies or devices may also be mounted on the package substrate. For example, the second or more dies (not shown) can be a surface mount device which may include an application specific integrated circuit (ASIC) such as an amplifier, memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices. Other suitable types of devices may also be mounted on the package substrate.

Figure 1D:
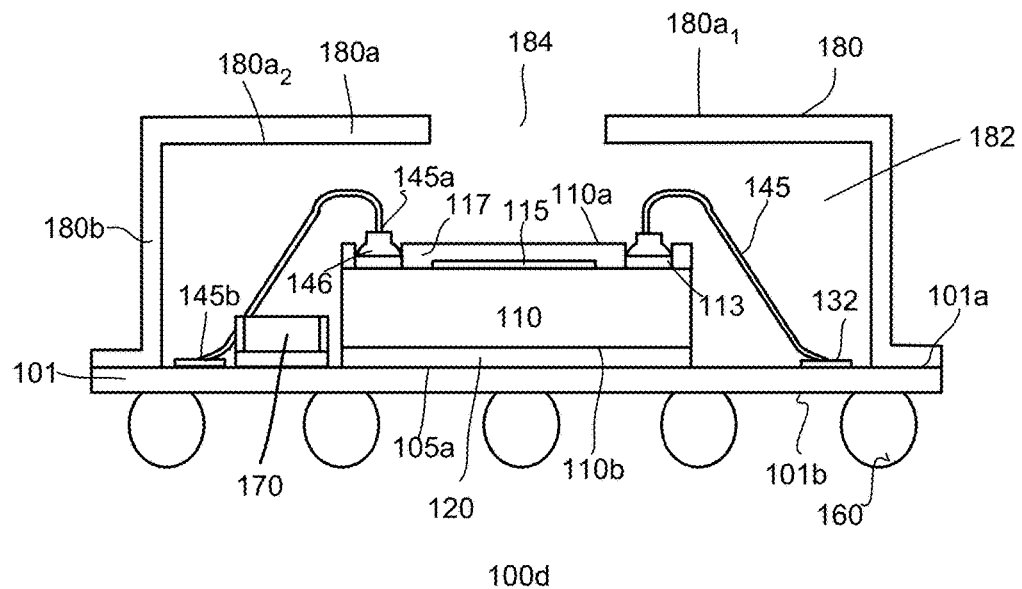
Figure 1D:
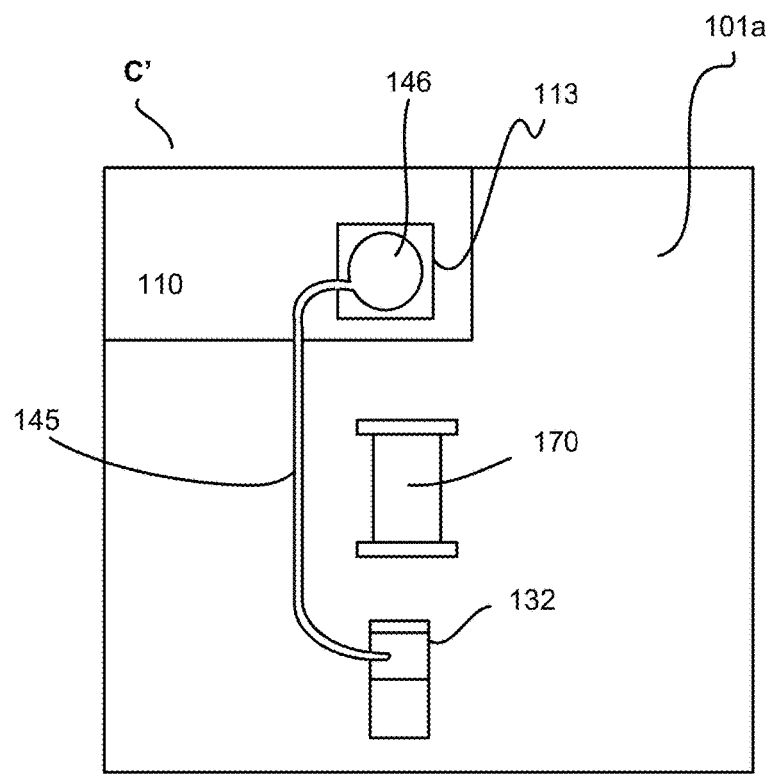

In the case where the semiconductor package includes at least a die having a sensing element 110, such as a MEMS die, and a surface mount device 170, the wire bond 145 may include any suitable bond or loop configuration or profile which avoids high vertical wire loops which could potentially lead to thicker package. In one embodiment, the wire bond may include a bond profile having a lateral curvature as shown in FIG. 1d. Such bond or loop profile may be referred to as J bond or J loop and the top view of a portion of the package is shown as C'. Such configuration is advantageous as it allows a thinner package to be formed and enables a more reliable and stable loop profile. Other suitable types of bond or loop profile may also be used.

A cap 180 is disposed over the first major surface of the package substrate as shown in FIGS. 1a-1d. The cap is attached to the first major surface of the package substrate using an adhesive, solder paste, etc. (not shown). In one embodiment, a ground ring 190 may be provided on and exposed from the first major surface of the package substrate to which the cap is electrically attached as shown in FIG. 1a. The cap and the package substrate, in one embodiment, define an inner cavity 182 which accommodates the semiconductor die 110 and the wire bonds 145. The cap includes a sufficient height to cover the semiconductor die and wire bonds. For example, the cap includes a height of about 0.5 to 1 mm. Other suitable height dimensions may also be useful, depending on design requirement or specific application.

In one embodiment, the cap includes flat or even top portion 180a having inner and outer surfaces $180a_{1-2}$ and sidewalls 180b which are about perpendicular to the top portion of the cap. For example, the sidewalls are vertical with respect to the horizontal top portion of the cap. Alternatively, the sidewalls of the cap are sloped or slanted. The angle θ of the sidewalls, being the acute or right angle between the sidewall and the horizontal plane of the first major surface of the substrate, for example, is about 70-90°. Other sidewall angles may also be useful. The top portion and sidewalls of the cap, in one embodiment, are made of a single material as shown in FIGS. 1a-1d. For example, the top portion and the sidewalls of the cap are made of stainless steel, copper, aluminum, etc. Other suitable types of material may also be useful for the cap. One or more plating layers may be formed thereon. In one embodiment, the plating material can be nickel or matt tin. Other suitable types of plating material may also be useful.

Figure 1E:
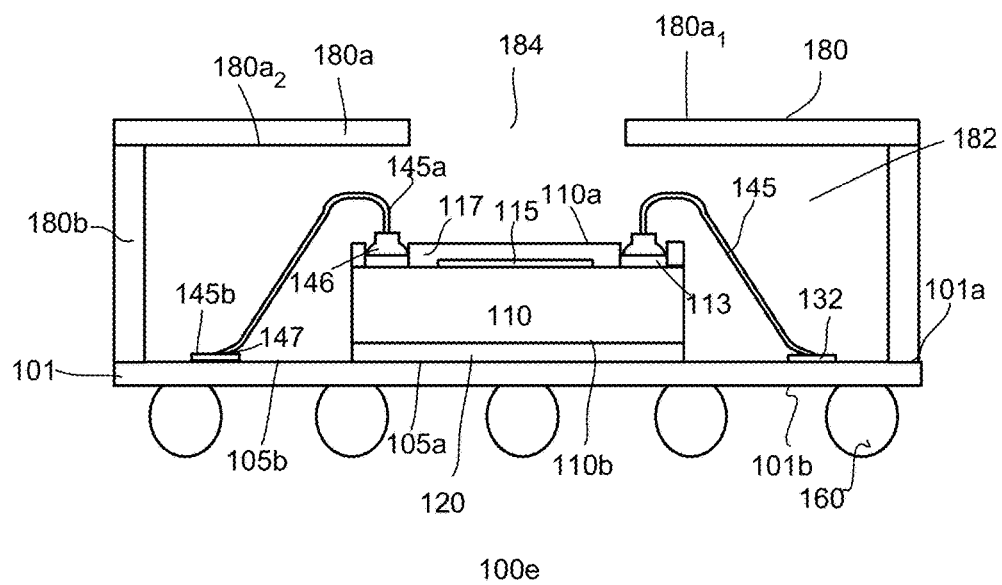

In another embodiment, the top portion and the sidewalls of the cap are made of different materials. For example, as shown in FIG. 1e, the top portion 180a of the cap includes a first material while the sidewalls 180b of the cap include a second material. The first material, for example, includes transparent material, such as glass. Any other suitable types of material which is transparent to the desired range of light signal may be used for the top portion of the cap. The sidewalls of the cap, for example, include a dielectric material, such as mold compound. Other suitable types of material may be used for forming the sidewalls of the cap.

Although the cap having two different materials is shown to be modified or applied for the embodiment shown in FIG. 1a, it is understood that such configuration of the cap may also be suitable for the embodiments shown in FIGS. 1b-1d. As such, details for these packages may not be described or described in detail.

In one embodiment, the cap includes an opening 184 which passes through the inner and outer surfaces of the top portion 180a of the cap as shown in FIGS. 1a-1e. The opening, for example, serves as an access port providing access path between the sensing element and the external environment outside of the semiconductor package. The wire bonds, for example, are also directly exposed to the ambient through the access port of the cap as shown in FIGS. 1a-1e. For illustration purposes, one opening is shown. Providing more than one opening may also be useful. The opening, for example, is disposed over the sensing element. Providing the opening at other location of the cap may also be useful.

Figure 2:
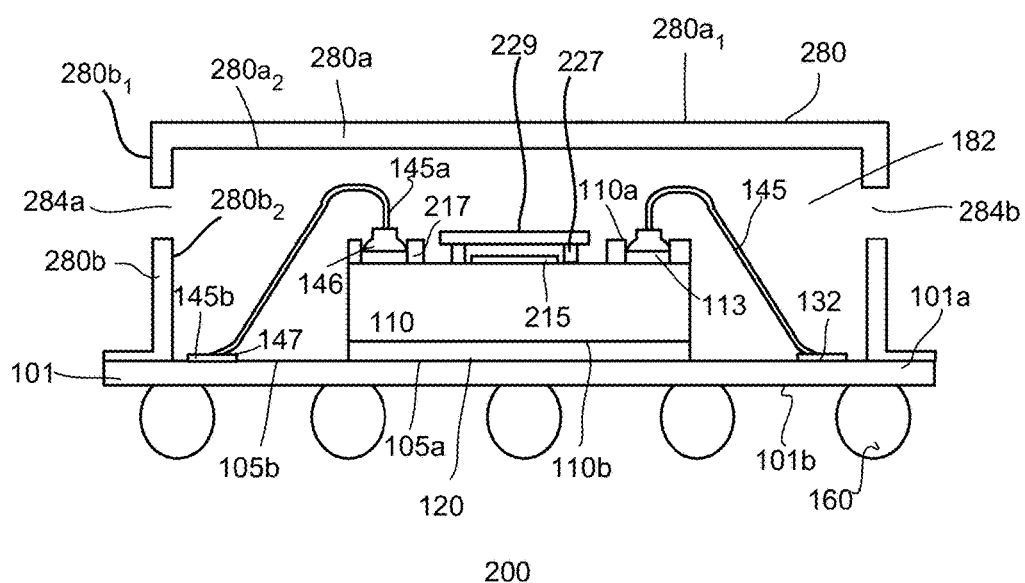
FIG. 2 shows simplified cross-sectional view of another embodiment of a package.

FIG. 2 shows simplified cross-sectional view of another embodiment of a package 200. The package is similar to the package as described in FIG. 1a. For example, the package includes a package substrate 101 and a semiconductor die 110 attached to the first major surface 101a of the substrate. The semiconductor die is electrically connected to the package substrate using the insulated wires 145 as described in FIG. 1a. As such, common elements may not be described or described in detail.

In one embodiment, the sensing element 215 is disposed on the active surface of the die. For example, the sensing element 215 and locations where die pads 113 are disposed are not covered by the final passivation layer 217. In one embodiment, a sealing ring 227 is provided surrounding the sensing element and a lid 229 is attached on top of the sealing ring. The sealing ring, for example, includes a layer of $SiO_2$. Other suitable types of sealing material may also be useful. The lid, as shown in FIG. 2, is attached to the sealing ring by deposition. The lid, in one embodiment, includes a semiconductor lid. The lid, for example, may be made of materials such as SiN, SiC, Si and Ge. Other suitable types of materials may also be used for the lid so long as it can protect the sensing element from noise signal and provide mechanical stiffness to form a cavity underneath it.

A cap 280 is disposed over the first major surface of the package substrate as shown in FIG. 2. The cap is attached to the first major surface of the package substrate using an adhesive, solder paste, etc. (not shown). The cap, as shown, includes flat or even top portion 280a having inner and outer surfaces $280a_1$-$280a_2$ and sidewalls 280b which are about perpendicular to the top portion of the cap. In one embodiment, the cap includes one or more openings at the sidewalls 280b of the cap while the top portion 280a of the cap is devoid of an opening. For illustration purposes, two openings 284a-284b are shown. Providing more than two openings at the sidewalls and/or providing one or more openings at the top portion of the cap may also be useful. Providing the openings at any other suitable locations of the cap may also be useful. The openings at the sidewalls, for example, pass through the inner and outer surfaces $280b_1$-$280b_2$ of the sidewalls of the cap as shown in FIG. 2. The openings, as shown, serve as access ports providing access paths between the sensing element and the external environment. The wire bonds 145, for example, are also directly exposed to the ambient through the access ports of the cap as shown in FIG. 2.

Although the cap having two openings and the lid and sealing ring as shown in FIG. 2 is applied for, for example, the embodiment shown in FIG. 1a, it is understood that such configurations may also be suitable for the embodiments shown in FIGS. 1b-1e. As such, details for these packages may not be described or described in detail.

Figure 3A:
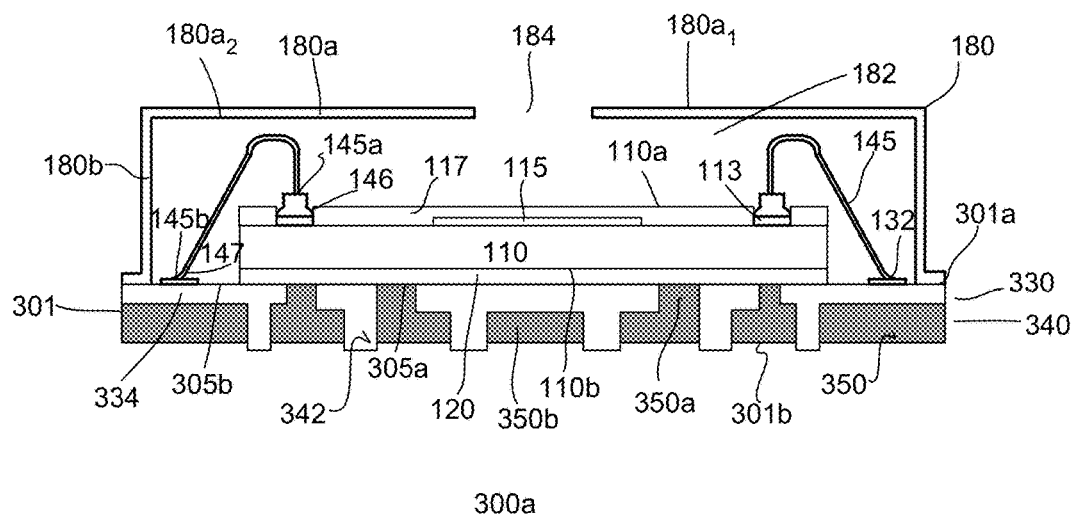
FIGS. 3a-3b show simplified cross-sectional views of various other embodiments of a semiconductor package.
Figure 3B:
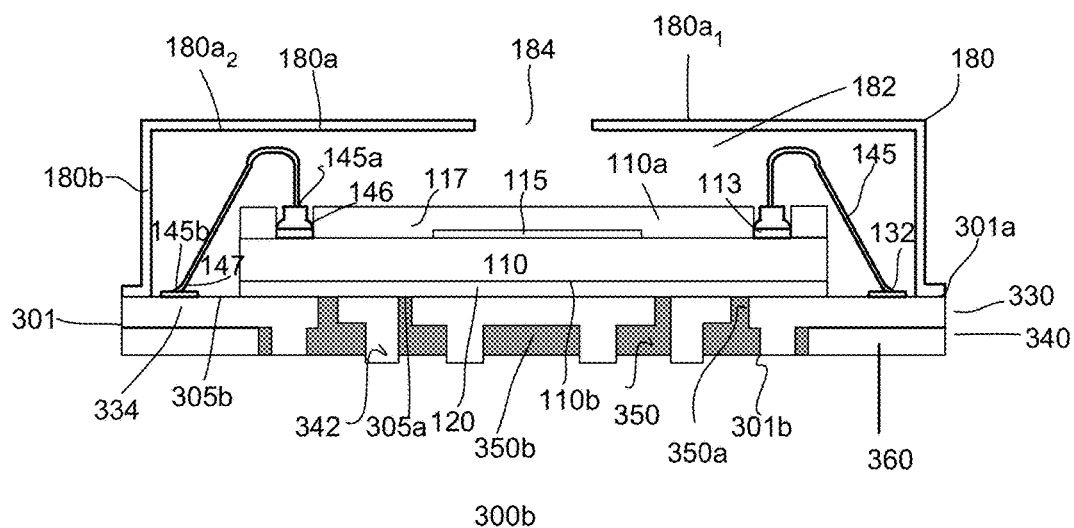

FIG. 3a-3b show simplified cross-sectional views of other embodiments of a package 300a-300b. The packages are similar to the package as described in FIG. 1a. For example, the packages include a package substrate 301 and a semiconductor die 110 attached to the first major surface 301a of the substrate. The semiconductor die is electrically connected to the package substrate using the insulated wires 145 as described in FIG. 1a. As such, common elements may not be described or described in detail.

In one embodiment, the package substrate 301 as shown in FIG. 3a differs from the package substrate 101 of FIG. 1a in that it includes a metallic structure. For example, the package substrate 301 may include a leadframe based or premolded leadframe substrate. Other suitable types of metallic substrate may also be useful. The metallic substrate may include, for example, copper. Other types of conductive materials may also be useful. In one embodiment, the metallic substrate includes a patterned metallic structure or leadframe. The patterned metallic structure defines conductive line and traces which allow routing of signals under the die region 305a, as well as areas outside of the die region such as the non-die region 305b. For example, the patterned metallic structure defines a line level 330 and a via or contact level 340. The line level includes conductive traces 334. In one embodiment, the conductive traces are proximate to the first or top major surface 301a of the package substrate and coupled to the contact pads 132. The via or contact level includes via contacts 342 which are coupled to the conductive traces. The via contacts may be coupled to the package contacts 160 on the second or bottom major surface 301b of the package substrate. For example, the via contacts may extend from the line level to the second major surface of the package substrate to couple to the package contacts (not shown). In one embodiment, the via contacts couple the conductive traces to respective package contacts. Other configurations of via contacts may also be useful.

In one embodiment, the package substrate includes a dielectric layer 350 as shown in FIG. 3a. The dielectric layer 350 may include first and second dielectric layers 350a-350b. For example, the first dielectric layer 350a isolates the conductive line and the second dielectric layer 350b isolates the via levels. Other configurations may also be useful. The dielectric layer, for example, includes polymer, such as mold compound, or solder mask material. Other types of dielectric materials, such as dielectric composites, may also be useful. The dielectric layer, for example, includes openings exposing the via contacts. The bottom surface of the dielectric layer, as shown, need not be coplanar with the second major surface of the package substrate. For example, the dielectric layer may be recessed below the via contacts, as shown in FIGS. 3a-3b. As shown, the via contacts may protrude above or extend beyond the bottom surface of the dielectric layer.

As described, the package substrate includes a conductive line and via level and a dielectric layer isolating the conductive lines and vias. In other embodiments, the package substrate may include two or more line and via levels and dielectric layers (not shown). In this case, either one of the via levels or a portion of one of the line levels is exposed from the bottom of the package substrate for further interconnection to external component.

In another embodiment, stiffener 360 may optionally be provided at the non-die region 305b of the package substrate. As shown in FIG. 3b, stiffener may be provided below the conductive traces located at the non-die region of the package substrate. Alternatively, the stiffener may be provided in the non-die region as well as partially extended to the die region 305a of the package substrate. The stiffener, for example, should be sufficiently rigid to serve as a support and withstand further processing steps. By way of non-limiting example, the stiffener includes a non-electrically conductive tape. Various types of materials may be used for the stiffener.

Although the semiconductor package as shown in FIGS. 3a-3b are similar to the embodiment shown in FIG. 1a, it is understood that such package substrate as described in FIGS. 3a-3b may also be suitable for the embodiments shown in FIGS. 1b-1e and FIG. 2. As such, details for these packages adopting the package substrate as described in FIGS. 3a-3b may not be described or described in detail.

Figure 4:
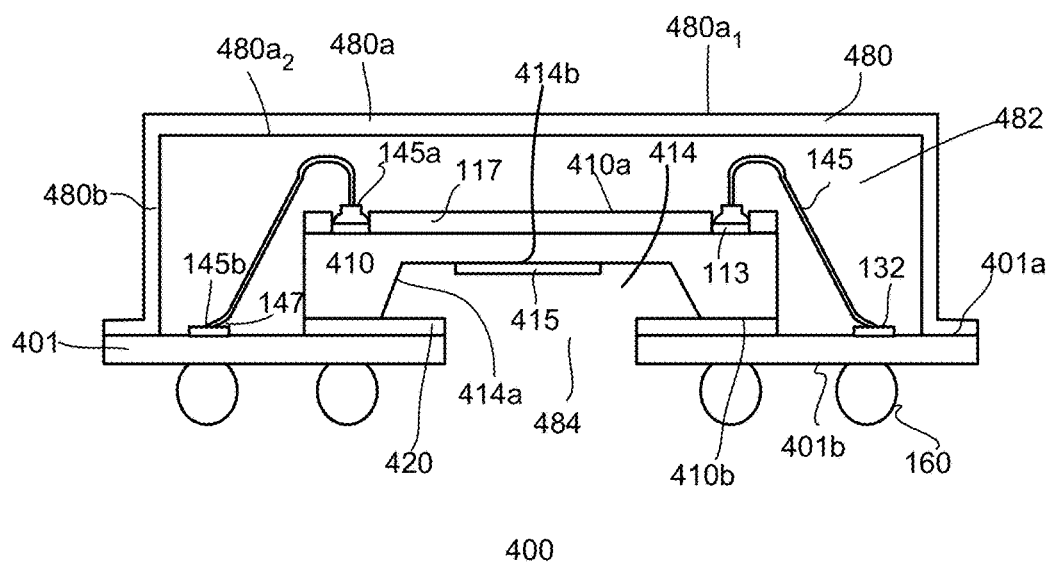
FIG. 4 shows simplified cross-sectional view of another embodiment of a semiconductor package.

FIG. 4 shows simplified cross-sectional view of another embodiment of a package 400. The package is similar to the package as described in FIG. 1a. For example, the package includes a package substrate 401 and a semiconductor die 410 attached to the first major surface 401a of the substrate. The semiconductor die is electrically connected to the package substrate using the insulated wires 145 as described in FIG. 1a. As such, common elements may not be described or described in detail.

In one embodiment, the semiconductor package 400 includes a semiconductor die having a recess 414. In one embodiment, the recess is disposed in an inactive region of the die. The recess, for example, extends from the inactive surface 410b of the die. In one embodiment, the dimension of the recess is sufficient to accommodate a sensor or sensing element 415. For example, the width (W) of the recess is smaller than the width of the die and the depth (D) of the recess is less than the height of the die. As shown in FIG. 4, the sensing element is attached to the bottom 414b of the recess. The sensing element, for example, is fabricated within the recess using known or other suitable semiconductor fabrication technologies. Other configurations of mounting the sensing element are also useful. Inner sidewalls 414a of the recess, for example, include a slanted profile. Providing other sidewall profiles, such as a vertical sidewall profile, is also useful.

The semiconductor die 410 is attached to the first major surface 401a of the package substrate using, for example, an adhesive 420. In one embodiment, the package substrate includes an opening 484 as shown in FIG. 4. The opening, in one embodiment, passes through the first and second major surfaces 401a-401b of the package substrate and the adhesive 420. The opening, for example, serves as an access port providing access path between the sensing element and the environment. For illustration purposes, one opening is formed through the first and second major surfaces of the package substrate. Providing more than one opening may also be useful. The opening, for example, is disposed below the sensing element. Providing the opening at other location of the package substrate may also be useful.

A cap 480 is disposed over the first major surface of the package substrate. The cap is attached to the first major surface of the package substrate using an adhesive, solder mask, etc. (not shown). The cap and the package substrate, similar to that described in FIG. 1, define an inner cavity 482 which accommodates the semiconductor die 410 and the wire bonds 145. The cap includes flat or even top portion 480a having inner and outer surfaces $480a_1$-$480a_2$ and sidewalls 480b which are about perpendicular to the top portion of the cap. Providing the cap having slanted sidewalls is also useful. The cap, in one embodiment, is devoid of an opening. The wire bonds 145, as shown in FIG. 4, are also directly exposed to the ambient through the access port of the package substrate.

The semiconductor package as described in FIG. 4 may optionally be modified to include the wire bond configuration, the protective layers and/or the wire bond loop profile as described in, for example, FIGS. 1b-1d respectively. The semiconductor package as described in FIG. 4 may also include the cap and lid and/or the package substrate as described in, for example, FIGS. 2 and 3a-3b respectively. As such, details of the features as described with respect to these embodiments will not be repeated or described in detail.

As described in the embodiments of FIGS. 1a-1e, 2, 3a-3b and 4, the wire bonds include insulated wires. The outer coating of the insulated wire protects the conductive wire from adverse effects such as contamination, oxidation and/or corrosion caused by the environment. The outer coating also prevents wire shorting. In addition, the use of the insulated wires avoids the use of encapsulant or mold compound to encapsulate the semiconductor die and wire bonds and avoids the use of hermetic sealing for the attachment of the cap.

Furthermore, a screen or other shield that is transparent to sound or light which is generally provided to cover the access port to prevent debris or particles from entering the package is also not required. This allows the sensing element to be exposed and interact or communicate directly with the environment/ambient, including internal environment and external environment outside of the package, leading to better sensing performance. Such configuration thus enables a simplified and cost effective package to be produced.

In addition, in embodiments where the second end of the wire bond which is bonded to the die pad includes a stitch bond on the stud bump, such as that shown in FIG. 1b, a low loop profile is formed. This enables a thinner semiconductor package to be formed. The stitch bond strength is also increased as the stitch bond is formed on the stud bump. Moreover, in embodiments where the wire bonds include a lateral loop configuration, such as that described in FIG. 1c, it avoids looping over the second device, leading to more stable and reliable electrical connection to be formed.

Figure 5:
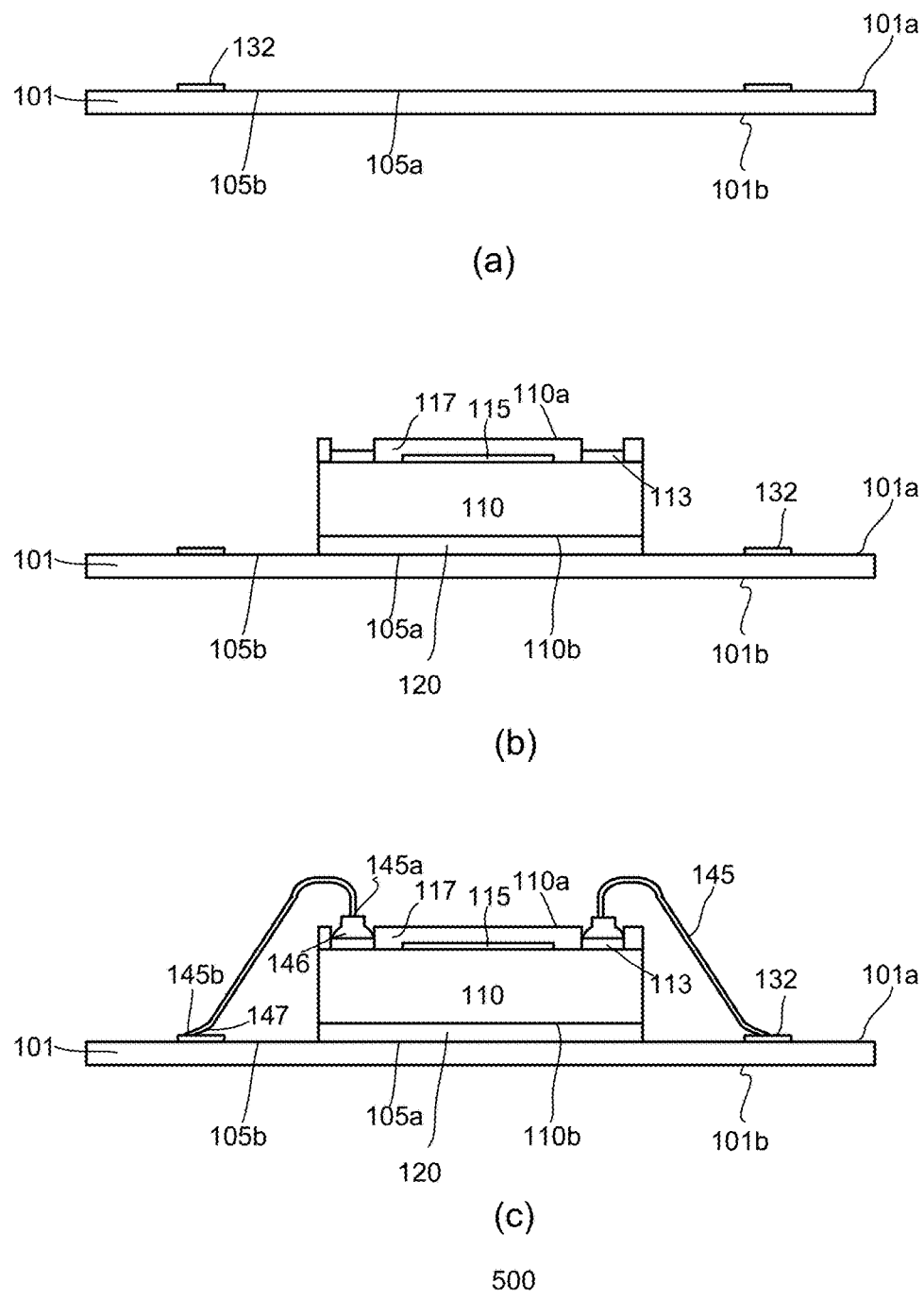
FIGS. 5a-5e, FIGS. 6a-6h, FIGS. 7a-7f and FIGS. 8a-8b show various embodiments of a process for forming a semiconductor package.
Figure 5:
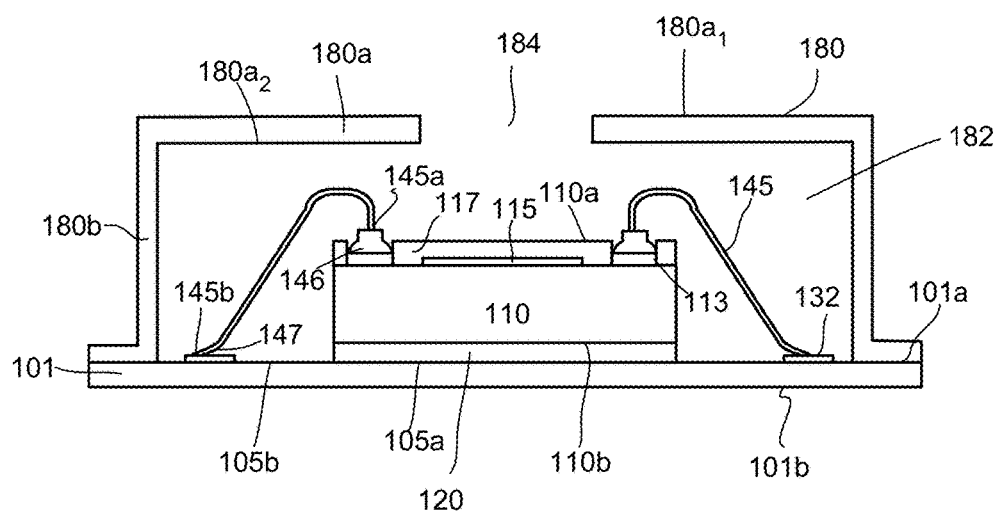
Figure 5:
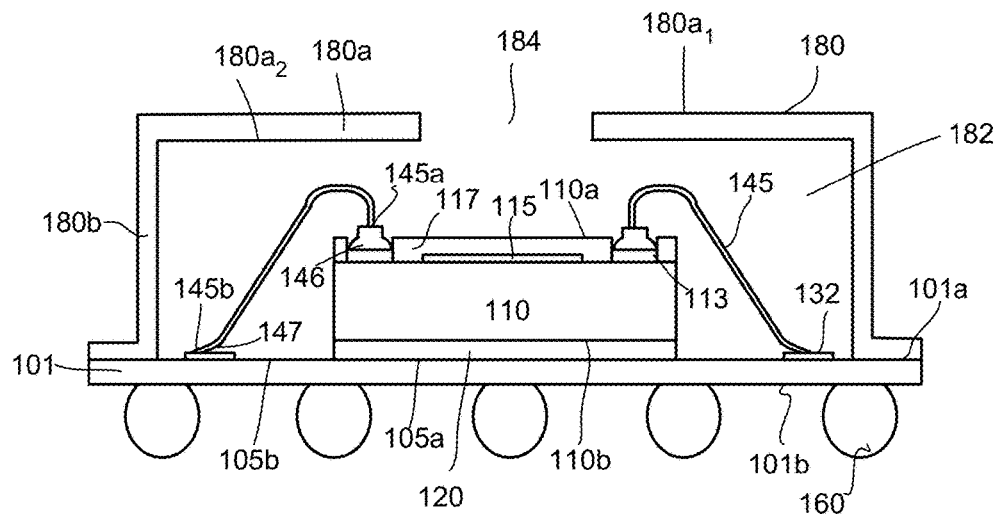

FIGS. 5a-5e show an embodiment of a process for forming a semiconductor package 500. Referring to FIG. 5a, a package substrate 101 is provided. The package substrate may be a single layer substrate or a multi-layer substrate. For a multi-layer substrate, the different layers can be laminated or built-up. Various materials can be used to form the package substrate. In one embodiment, the package substrate includes a printed circuit board (PCB) substrate. The PCB substrate, for example, includes a glass-reinforced epoxy, such as a FR-4 based laminated substrate. In another example, the substrate may include a polymer substrate which is not internally reinforced, such as but not limited to polyimide substrate. Other types of PCB materials are also useful. In another embodiment, the package substrate includes a metallic structure which provides both a die attach or mounting region for a die and electrical connections to the die and to external component. Alternatively, the package substrate includes ceramic or semiconductor based substrate. Other suitable types of substrate materials may be used as the package substrate.

The package substrate includes first and second major surfaces 101a-101b. The first major surface 101a, for example, may be referred to as the top surface and the second major surface 101b, for example, may be referred to as the bottom surface. Other designations for the surfaces may also be useful. The first major surface of the package substrate includes first and second regions. The first region 105a, for example, is a die or chip region and the second region 105b, for example, is a non-die region.

The process continues by providing and attaching a semiconductor die 110 to the die attach region defined on the top major surface of the package substrate as shown in FIG. 5b. The semiconductor die includes a sensor or sensing element 115, similar to that described in FIG. 1a. As such, details of the die having the sensing element will not be described or described in detail. In one embodiment, the die is mounted to the die attach region using, for example, an adhesive 120. Other suitable methods may also be used to mount the die to the package substrate.

Referring to FIG. 5c, the process continues by electrically coupling the die pads 113 to the contact pads 132 on the top surface of the substrate using wire bonds 145. The wire bonds, in one embodiment, include insulated wires such as that described in FIGS. 1a-1e, 2, 3a-3b and 4. As such, details of the insulated wires will not be described in detail. The insulated wire bonds may be formed and applied to the die and contact pads using any suitable techniques. In one embodiment, a first end 145a of the wire bond is bonded to the die pad so as to form a ball bond 146 while a second end 145b of the wire bond is bonded to the contact pad so as to form a stitch or wedge bond 147. Other suitable types of wire bonding configuration may also be useful.

The process continues by providing and attaching a cap 180 over the package substrate. The cap, for example, is attached to the package substrate using an adhesive, solder mask, etc. (not shown). Other suitable techniques may also be employed to mount the cap to the package substrate. The cap, for example, is similar to the one described in FIGS. 1a-1e. For example, the cap includes an opening 184 which passes through the inner and outer surfaces $180a_1$-$180a_2$ of the top portion 180a of the cap as shown in FIG. 5d. The opening, for example, serves as an access port providing access path between the sensing element and the environment. The wire bonds 145, for example, are also directly exposed to the ambient through the access port of the cap. For illustration purposes, one opening is shown. Providing more than one opening may also be useful. The opening, for example, is disposed over the sensing element. Providing the opening at other location of the cap may also be useful.

The cap, in one embodiment, is formed of a metal foil. The cap having the top portion 180a and sidewalls 180b configuration as integral part thereof is formed from, for example, a metal foil by punching. The metal foil may include one or more plating layers. For example, the cap can be made of nickel plated copper or aluminum foil. The opening of the cap, in one embodiment, is formed by etching, drilling, punching, grinding or any combination thereof. Other suitable materials and techniques may be used to form the cap.

The process continues by forming package contacts 160. For example, the package contacts are formed on via contacts (not shown) on the second surface of the package substrate as shown in FIG. 5e. The package contacts, for example, may include spherical shaped structures or balls arranged in grid pattern to form a BGA type package. As such, a semiconductor package such as that shown in FIG. 1*a* is formed. The package contacts are formed of a conductive material. The package contacts, for example, can be formed from solder. Various types of solder can be used to form the package contacts. For example, the solder can be a lead-based or non lead-based solder.

The process as described with respect to FIGS. 5*a*-5*e* may be modified. For example, the process may be modified in which a stud bump is formed on the die pad. A first end of the wire including a ball is connected to the contact pad 132 and the second end of the wire is bonded on the stud bump to form a stitch bond. As a result, a semiconductor package such as that shown in FIG. 1*b* is produced. Moreover, the process may optionally include the step of providing and forming protective layers 150 covering and protecting the stud bump and/or the stitch or ball bond at the first or second end of the wire bond so that a semiconductor package such as that illustrated in FIG. 1*c* is formed. The protective layer, for example, may be cured by UV light or heat. Alternatively, the process may optionally be modified to provide a cap of which the top portion and sidewalls of the cap are made of different materials such as that shown in FIG. 1*e*. For example, sidewalls of the cap which are made of dielectric material such as mold compound may be provided over the package substrate prior to attaching the die on the package substrate. The top portion of the cap made of transparent material having an opening may be provided and attached to the sidewalls after forming the insulated wire bonds.

Figure 6:
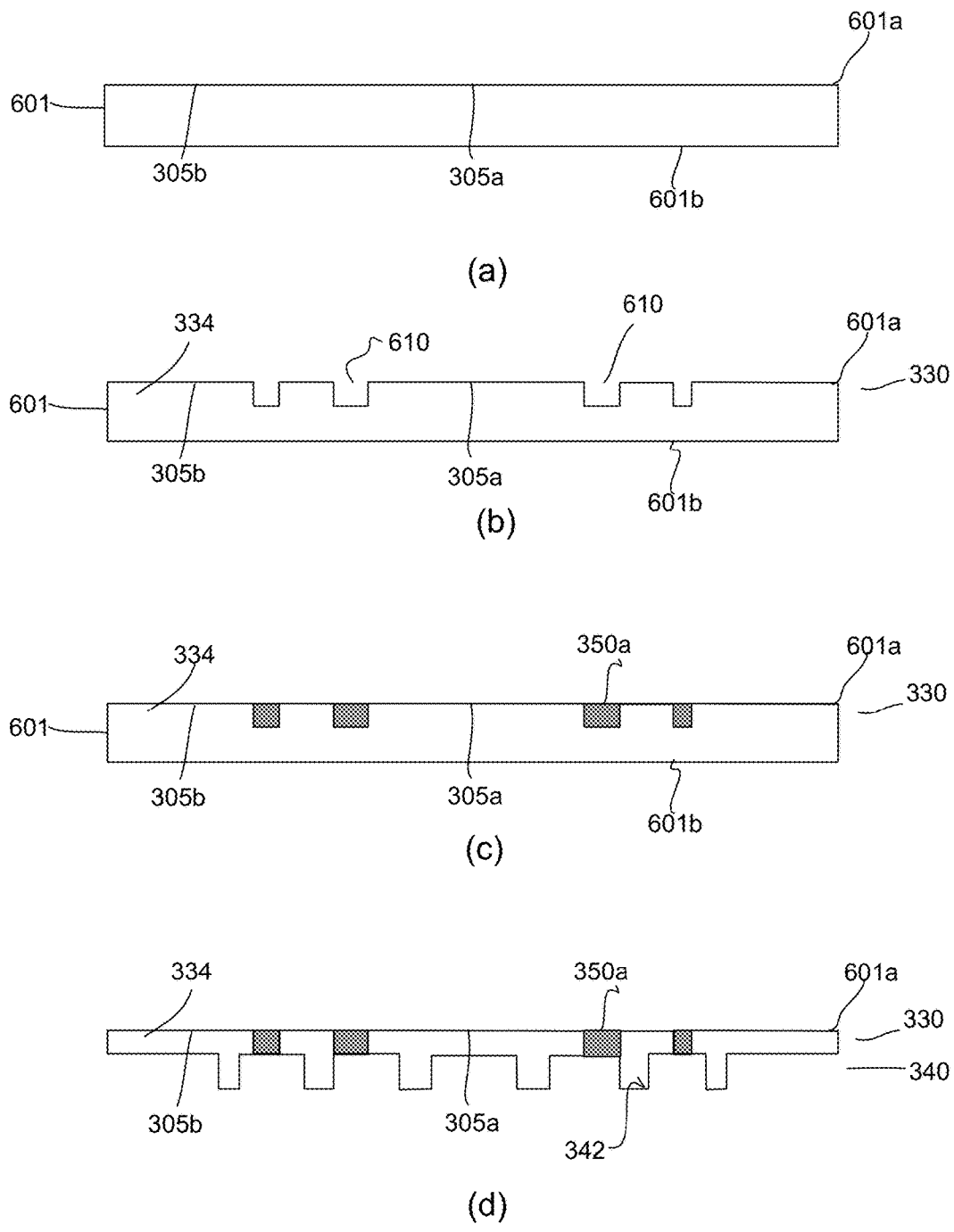
Figure 6:
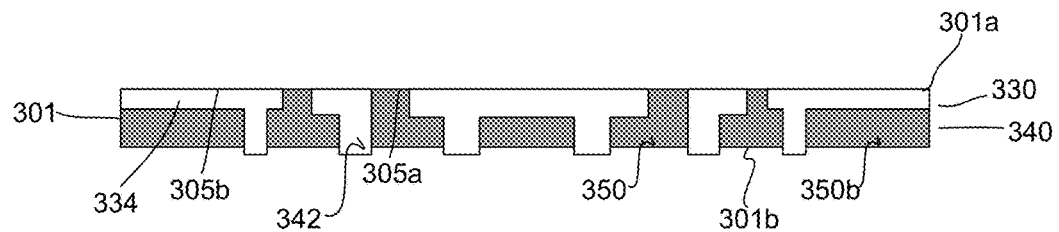
Figure 6:
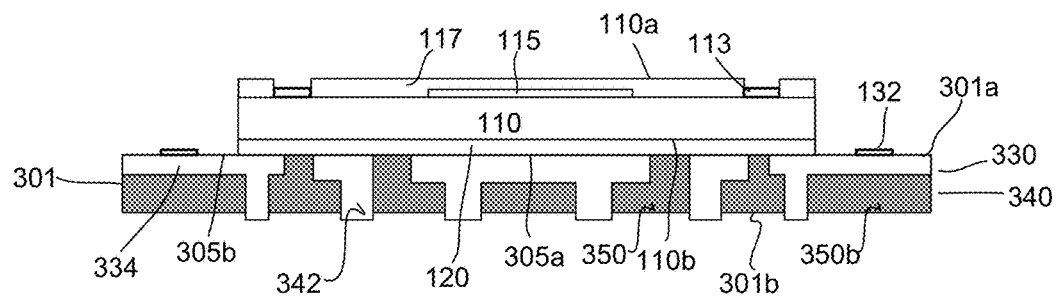
Figure 6:
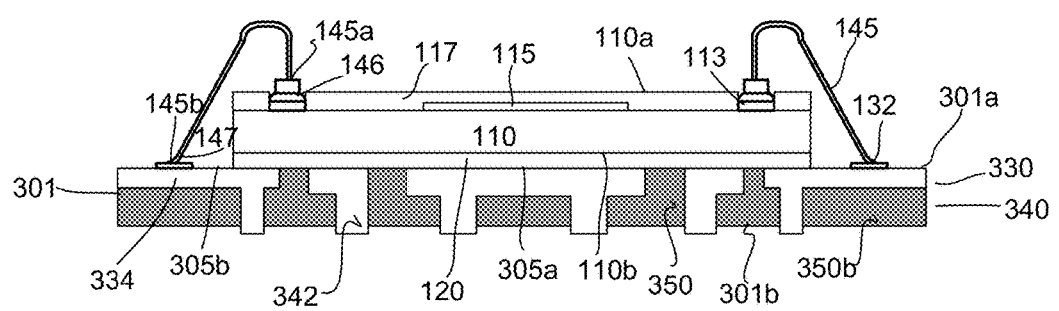
Figure 6:
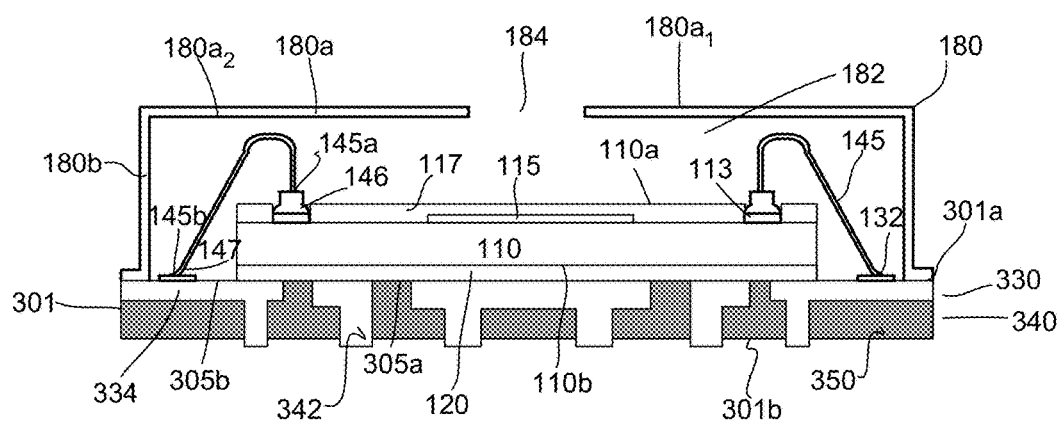

FIGS. 6*a*-6*h* show another embodiment of a method for forming a semiconductor package 600. Referring to FIG. 6*a*, a base or metallic carrier 601 is provided. The base carrier, for example, may include a leadframe. Other suitable types of base carrier may also be used. The base carrier 601, in one embodiment, includes a conductive carrier having first and second major surfaces 601*a*-*b*. The first and second major surfaces, for example, include planar surfaces. Providing any one of the major surfaces to be non-planar may also be useful. The first major surface, for example, includes die attach region 305*a* and non-die region 305*b*. The conductive carrier, for example, includes Cu, Cu alloy, Fe or Ni—Fe alloy. Other suitable types of conductive materials may also be useful. The thickness of the conductive carrier, for example, is about 100-300 µm. Other suitable thicknesses may also be useful. The conductive carrier, for example, may serve as part of the interconnect structures, such as conductive trace or line and via contacts, of the package substrate as will be described later.

In one embodiment, the process continues by processing the carrier. In one embodiment, a first plated pattern (not shown) is formed on the first or top major surface of the carrier 601*a*. In one embodiment, the first plated pattern defines the conductive traces of the line level 330. The carrier is patterned, removing portions exposed by the first plated pattern (not shown) as shown in FIG. 6*b*. For example, a wet etch is used to remove exposed portions of the carrier. In one embodiment, the first major surface 601*a* is processed such that it includes a non-planar surface having protruded portions and a plurality of recesses 610. The protruded or unetched top portions of the carrier define the conductive traces 334 while the recesses 610 define locations of which isolation regions separating adjacent conductive traces are to be formed.

Referring to FIG. 6*c*, the process continues to form a first dielectric material 350*a* which fills the recesses between the conductive traces. In one embodiment, a dielectric layer is formed on the frontside or top surface of the carrier, filling the spaces between the conductive traces. The dielectric layer, for example, is formed of polymer, solder mask or dielectric composite materials. The dielectric layer, for example, may be formed by dispensing, printing, lamination or spin on techniques. Other dielectric materials and techniques may also be useful.

The process continues by processing the carrier. A second plated pattern (not shown) is formed on the second or bottom major surface of the carrier 601*b*. In a more specific example, the first plated pattern is different from the second plated pattern. In one embodiment, the second plated pattern defines the via contacts of the via level 340. For example, the second plated pattern corresponds to via contacts. The carrier is patterned, removing portions of the bottom surface of the carrier which are exposed by the second plated pattern as shown in FIG. 6*d*. For example, a wet etch is used to remove exposed portions of the carrier. This leaves remaining portion of the carrier which forms the via contacts 342 of the via level as shown in FIG. 6*d*.

Referring to FIG. 6*e*, the process continues to form a second dielectric material 350*b* which fills the gaps between the via contacts. In one embodiment, a dielectric layer is formed on the backside of the carrier, filling the spaces between the via contacts. The dielectric layer 350*b*, for example, is formed of polymer, solder mask or dielectric composite materials. The dielectric layer, for example, may be formed by dispensing, printing, lamination or spin on techniques. Other dielectric materials and techniques may also be useful.

The first and second plated patterns as described above, for example, may be formed over the surfaces of the carrier in a single process step. Forming the first and second plated patterns on the surfaces of the carrier in separate process steps may also be useful. The processes as described with respect to FIGS. 6*a*-6*e* form the package substrate 301 of the package.

Referring to FIG. 6*f*, a semiconductor die 110 is provided and attached to the die attach region 305*a* defined on the top major surface of the package substrate 301*a*. The semiconductor die includes a sensor or sensing element 115, similar to that described in FIG. 1*a*. As such, details of the die will not be described or described in detail. In one embodiment, the die is mounted to the die attach region using, for example, an adhesive 120. Other suitable methods may also be used to mount the die to the carrier.

The process continues by electrically coupling the die pads 113 to the top surface of the carrier using wire bonds as shown in FIG. 6*g*. The wire bonds, in one embodiment, include insulated wires 145 such as that described in FIGS. 1*a*-1*e*, 2, 3*a*-3*b* and 4. As such, details of the insulated wires will not be described in detail. The insulated wire bonds may be formed and applied to the die and contact pads using any suitable techniques. For example, the technique as described in FIG. 5*c* may be used. Other suitable techniques may also be useful.

The process continues by providing and attaching a cap 180 over the package substrate as shown in FIG. 6*h*. The cap, for example, is attached to the package substrate using an adhesive, solder mask, etc. (not shown). Other suitable techniques may also be employed to mount the cap to the package substrate. The cap, for example, is similar to the one described in FIGS. 1*a*-1*e*. For example, the cap includes an opening 184 which passes through the inner and outer surfaces $180a_1$-$180a_2$ of the top portion 180*a* of the cap as shown in FIG. 6*h*. The opening, for example, serves as an access port providing access path between the sensing element and the environment. The wire bonds, for example, are also directly exposed to the ambient through the access port of the cap. The cap having the opening, for example, is formed by techniques described in FIG. 5d above.

The process may continue to form package contacts 160 on the bottom of the package substrate, similar to that described in FIG. 5e above. As such, a semiconductor package such as that shown in FIG. 3a is formed.

Figure 7:
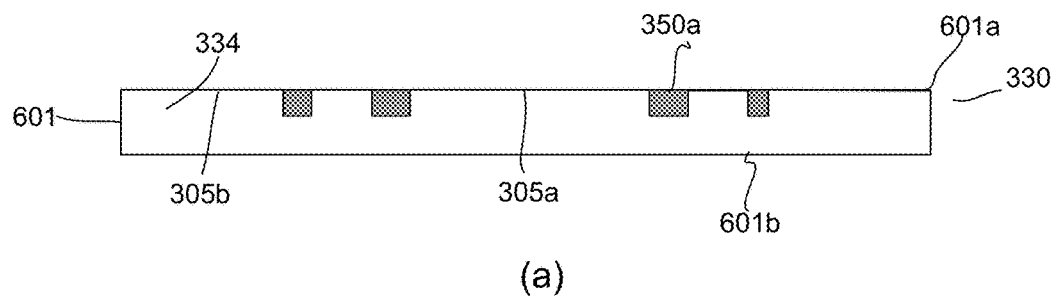
Figure 7:
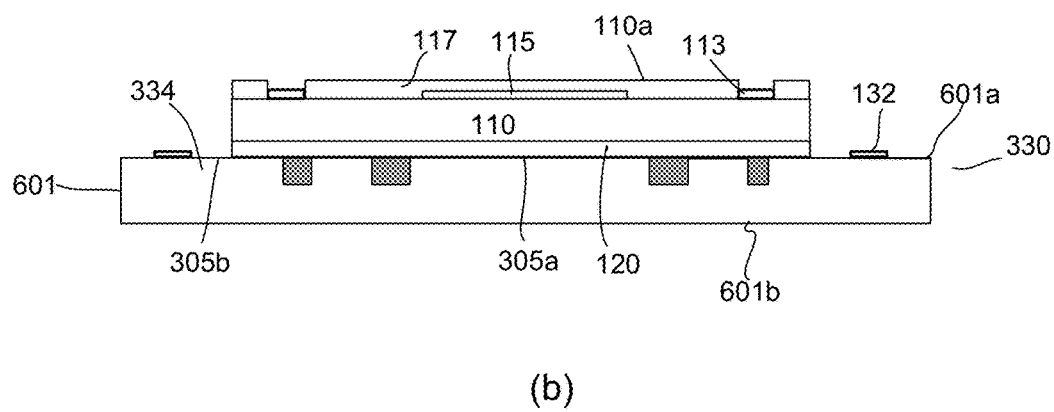
Figure 7:
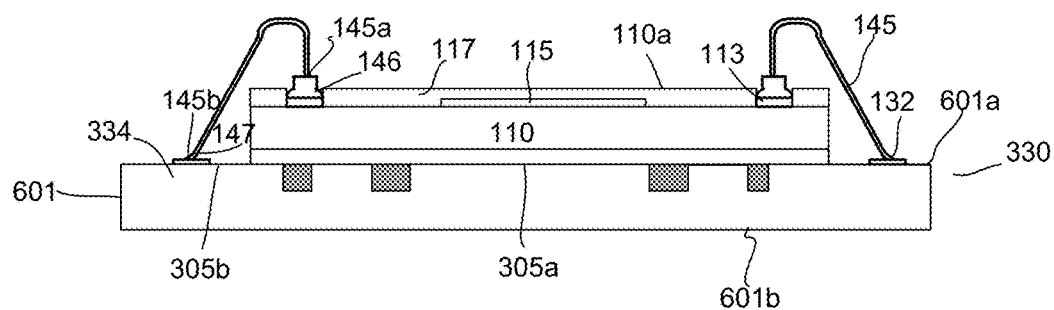
Figure 7:
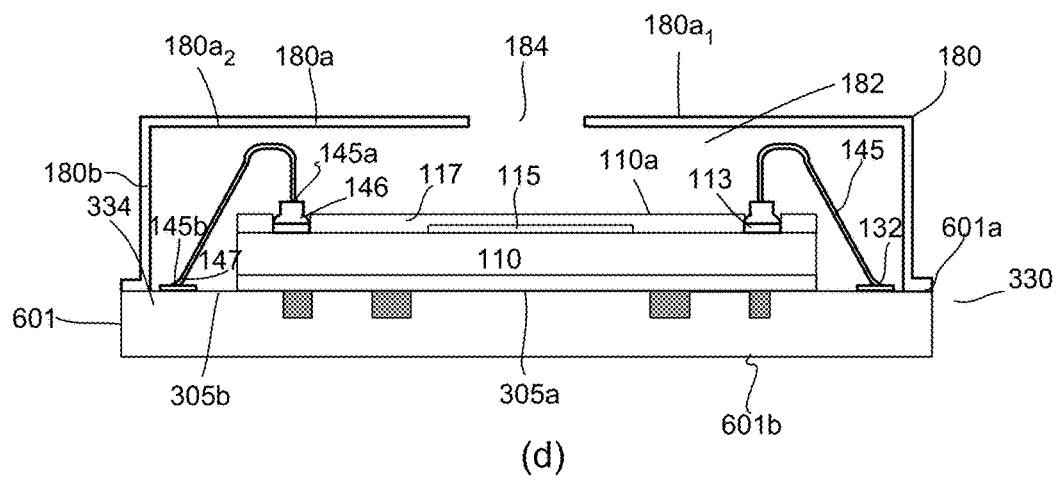
Figure 7:
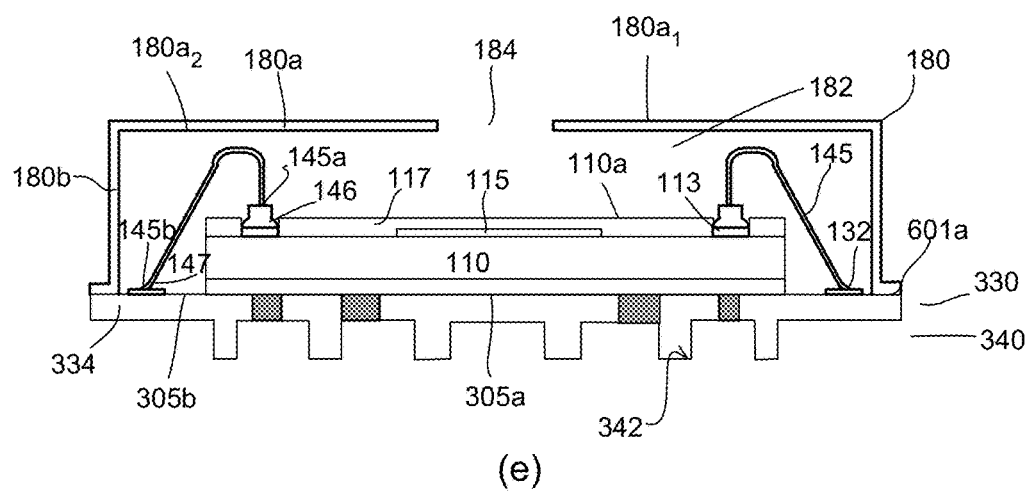
Figure 7:
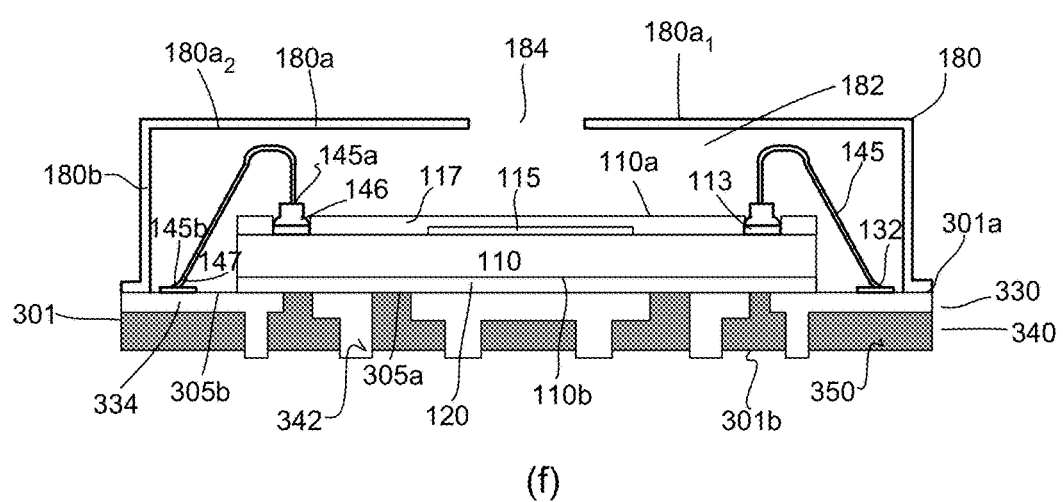

FIGS. 7a-7f show another embodiment of a method for forming a semiconductor package 700. The process includes similar process steps as that described in FIGS. 6a-6h. As such, common process steps may not be described or described in detail. Referring to FIG. 7a, a partially processed package substrate is provided. The partially processed package substrate is at the same stage as that described in FIG. 6c. The materials and features of the partially processed carrier are the same as that described in FIG. 6c. As such, common elements may not be described or described in detail.

In one embodiment, the process continues by providing and attaching a semiconductor die 110 to the die attach region 305a defined on the top major surface of the carrier 601 as shown in FIG. 7b. The semiconductor die includes a sensor or sensing element 115, similar to that described in FIG. 1a. In one embodiment, the die is mounted to the die attach region using, for example, an adhesive 120, similar to that described in FIG. 6f, except that the second or bottom surface 601b of the carrier is not yet processed at this stage. Other suitable methods may also be used to mount the die to the carrier.

Referring to FIG. 7c, the process continues by electrically coupling the die pads 113 to the top surface of the carrier using wire bonds. The wire bonds, in one embodiment, include insulated wires 145 such as that described in FIGS. 1a-1e, 2, 3a-3b and 4. As such, details of the insulated wires will not be described in detail. The insulated wire bonds may be formed and applied to the die and contact pads 132 using any suitable techniques. For example, the technique as described in FIG. 5c may be used. Other suitable techniques may also be useful.

The process continues by providing and attaching a cap 180 over the package substrate as shown in FIG. 7d. The cap and method of attaching the cap, for example, are the same as that already described in FIG. 6h. As such, this process step will not be described. In one embodiment, the process continues to process the second or bottom surface 601b of the carrier, while having the cap attached to the top surface of the carrier 601a as shown in FIG. 7e. The second surface 601b of the carrier is patterned, removing portions of the bottom surface of the carrier which are exposed using the technique as described in FIG. 6d. The remaining bottom portions of the carrier form the via contacts 342 of the via level as shown in FIG. 7e.

Referring to FIG. 7f, the process continues to form a second dielectric material 350b which fills the gaps between the via contacts. The second dielectric material and the method of forming thereof are the same as that described in FIG. 6e. As such, these common features will not be described or described in detail.

The process may continue to form package contacts 160 on the bottom of the package substrate, similar to that described in FIG. 5e above. As such, a semiconductor package such as that shown in FIG. 3a is formed.

Figure 8A:
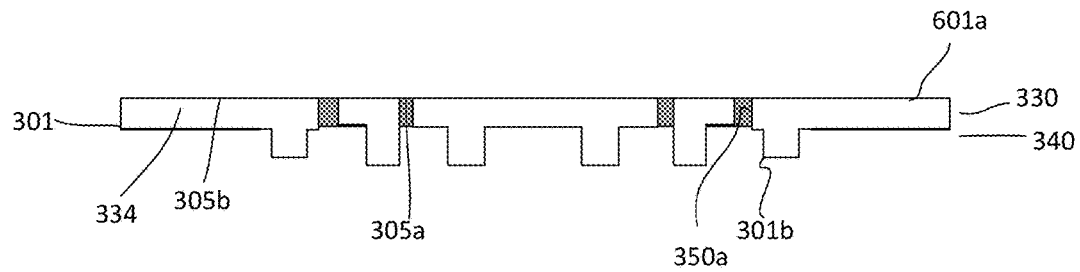
Figure 8A:
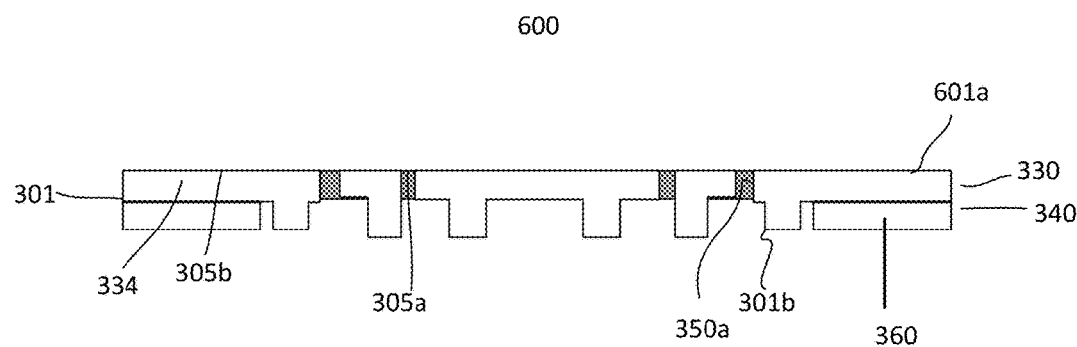
Figure 8A:
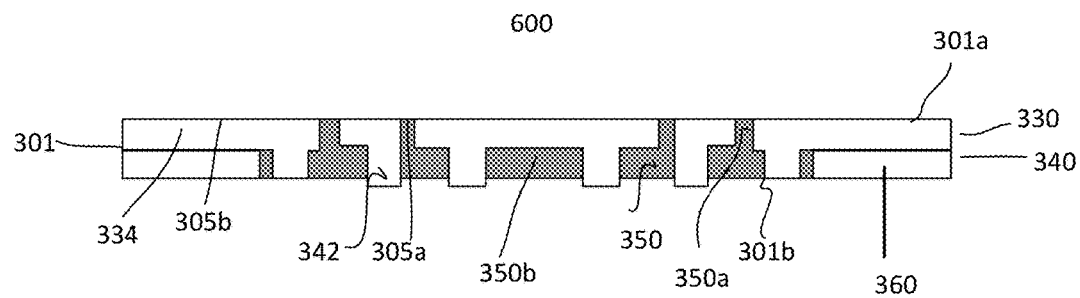
Figure 8B:
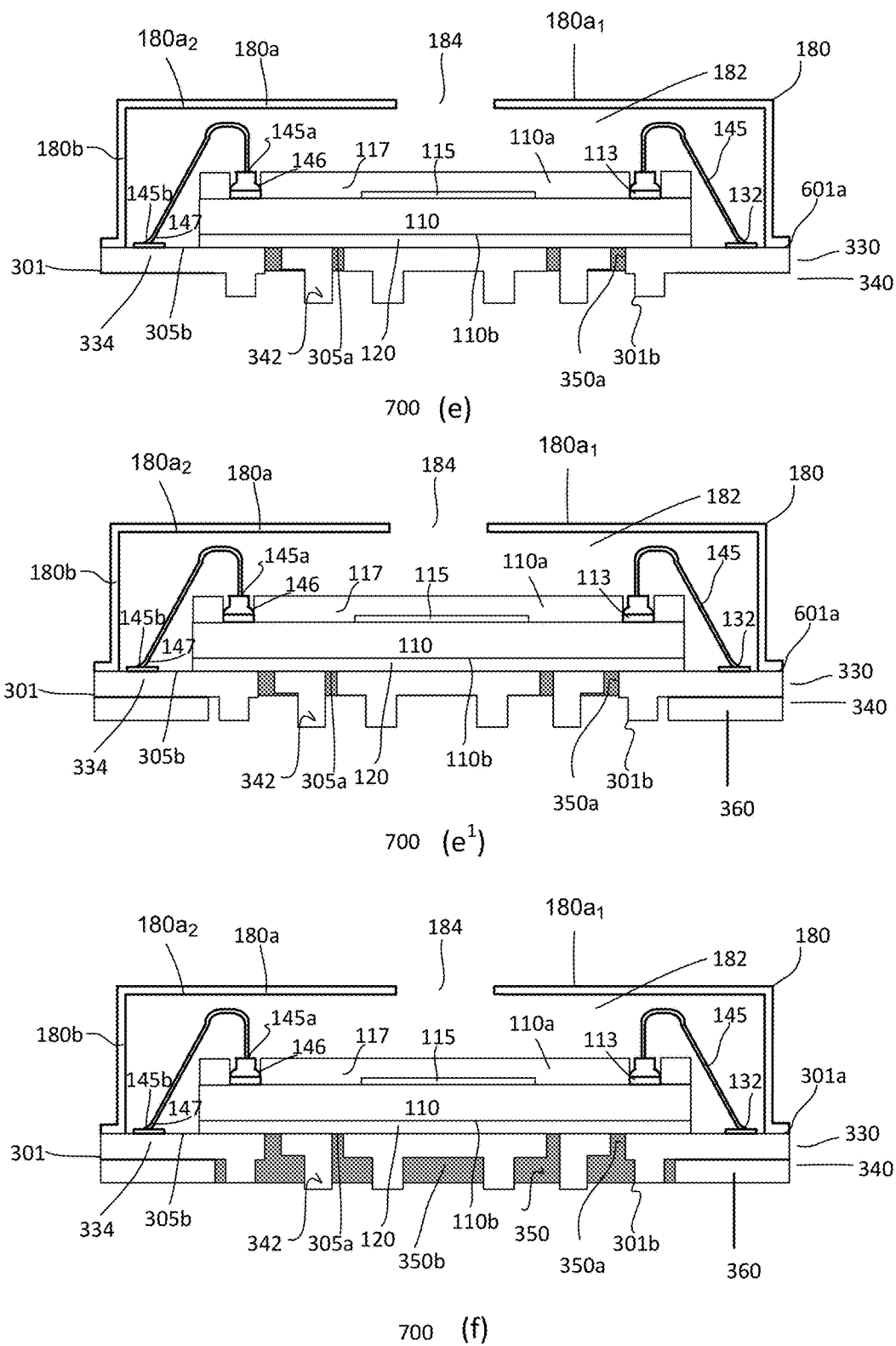

The processes as described with respect to FIGS. 6a-6h and FIGS. 7a-7f may be modified to further include a stiffener. For example, the process may further include providing a stiffener below the conductive traces located at the non-die region of the package substrate. Alternatively, the stiffener may be provided in the non-die region as well as partially extended to the die region 305a of the package substrate. The stiffener 360, for example, may be provided after patterning the bottom surface of the carrier (e.g., after FIG. 6d or 7e) and prior to forming the dielectric layer, as illustrated in FIGS. 8a-8b. The stiffener, for example, should be sufficiently rigid to serve as a support and withstand further processing steps. By way of non-limiting example, the stiffener includes a non-electrically conductive tape. Various types of materials may be used for the stiffener. As a result, a semiconductor package such as that shown in FIG. 3b is produced.

It is understood that the processes as described with respect to FIGS. 6a-6h and FIGS. 7a-7f may optionally be further modified to include features disclosed in FIGS. 1b-1e and FIG. 2. As such, these modifications will not be described or described in detail. Furthermore, for ease of understanding, certain method steps as described above are delineated as separate steps; however, these separately delineated steps should not be construed as necessarily order dependent or being separate in their performance.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor package comprising:
   providing a package substrate, wherein the package substrate comprises first and second major surfaces and a die region on the first surface thereof;
   processing the first surface of the substrate, wherein the processed first surface of the substrate comprises protruded portions corresponding to conductive traces and a plurality of recesses between the conductive traces;
   processing the second surface of the substrate to form via contacts and a plurality of recesses between the via contacts;
   providing a stiffener at least at non-die region of the package substrate, wherein the stiffener is provided below and in direct contact with the conductive traces which are directly coupled to and in direct contact with contact pads disposed on the first surface of the package substrate;
   providing a first dielectric layer and filling the recesses between the conductive traces with the first dielectric layer, wherein the first dielectric layer isolates the conductive traces;
   providing a second dielectric layer and filling the recesses between the via contacts with the second dielectric layer, wherein the second dielectric layer isolates the via contacts;
   providing a die having a sensing element;
   attaching the die on the die region;
   electrically coupling the die to the contact pads that are disposed on the first surface of the package substrate and are directly coupled to the conductive traces by insulated wire bonds; and
   providing a cap over the first surface of the package substrate, wherein the cap and the first surface of the package substrate define an inner cavity which accommodates the die and the insulated wire bonds, and wherein the insulated wire bond comprises first and second ends, wherein the first end is bonded to die pad of the die while the second end is bonded to the contact pad, the insulated wire bond comprises a conductive wire and an outer coating surrounding the conductive wire, wherein the outer insulator coating covers and extends to about the entire length of the conductive wire except at portions which are bonded to the die pad and contact pad, and the insulated wire bonds are directly exposed to an environment through at least one access port of the package.

2. The method of claim 1 wherein:
the cap comprises a top portion and sidewalls; and
the access port extends through inner and outer surfaces of the top portion of the cap.

3. The method of claim 1 wherein:
attaching the die is performed after providing a second dielectric layer.

4. The method of claim 1 wherein:
attaching the die is performed prior to processing the second surface of the substrate.

5. The method of claim 4 comprising:
wherein the second dielectric layer is provided after providing the stiffener.

6. The method of claim 5 wherein:
the stiffener partially extends to the die region of the package substrate; and
the stiffener is provided after processing the second surface of the substrate and prior to providing the second dielectric layer.

7. The method of claim 1 wherein the first and second dielectric layers are separate dielectric layers.

8. The method of claim 1 wherein the package substrate comprises a printed circuit board, metallic, ceramic, semiconductor or leadframe based substrate.

9. The method of claim 1 wherein the first end of the wire bond is bonded to die pad of the die so as to form a ball bond while the second end of the wire bond is bonded to the contact pad so as to form a stitch bond.

10. The method of claim 9 comprising providing protective layers to cover the ball bond and the stitch bond.

11. The method of claim 1 wherein the first end of the wire bond comprises a ball which is electrically coupled to the contact pad and the second end of the wire bond is bonded to a stud bump which is over the die pad so as to form a stitch bond.

12. The method of claim 11 comprising providing protective layers to cover the stud bump and the ball bond.

13. The method of claim 1 comprising providing a surface mount device over the first surface of the package substrate and wherein the wire bond comprises a loop profile having a lateral curvature.

14. The method of claim 1 wherein the cap comprises a top portion and sidewalls, wherein the top portion and sidewalls of the cap are made of different materials.

15. The method of claim 1 wherein:
the cap comprises a top portion and sidewall; and
the access port extends through inner and outer surfaces of the sidewall of the cap.

16. The method of claim 15 comprising providing a sealing ring surrounding the sensing element and providing a lid over a top surface of the sealing ring.

17. The method of claim 1 wherein the access port passes through the first and second surfaces of the package substrate.

18. The method of claim 17 wherein:
the die has a recess which extends from an inactive surface of the die; and
the sensing element is disposed at the bottom of the recess.

* * * * *